US009026958B1

United States Patent
Ghosh et al.

(10) Patent No.: US 9,026,958 B1
(45) Date of Patent: May 5, 2015

(54) METHOD AND SYSTEM FOR DOUBLE PATTERNING TECHNOLOGY (DPT) ODD LOOP VISUALIZATION FOR AN INTEGRATED CIRCUIT LAYOUT

(71) Applicant: Cadence Design Systems, Inc., San Jose, CA (US)

(72) Inventors: Sanjib Ghosh, Uttar Pradesh (IN); Harindranath Parameswaran, Uttar Pradesh (IN); Henry Yu, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/794,221

(22) Filed: Mar. 11, 2013

(51) Int. Cl.
*G06F 17/50* (2006.01)

(52) U.S. Cl.
CPC ..................................... *G06F 17/50* (2013.01)

(58) Field of Classification Search
USPC ............................ 716/50, 51, 52, 54, 55, 139
See application file for complete search history.

(56) References Cited

U.S. PATENT DOCUMENTS

| | | | |
|---|---|---|---|
| 5,538,815 A * | 7/1996 | Oi et al. | 430/5 |
| 7,761,821 B2 * | 7/2010 | Allen et al. | 716/52 |
| 8,448,100 B1 * | 5/2013 | Lin et al. | 716/54 |
| 8,484,607 B1 * | 7/2013 | Tang et al. | 716/136 |
| 8,516,402 B1 * | 8/2013 | Wang | 716/52 |
| 2004/0068712 A1 * | 4/2004 | Heng et al. | 716/21 |
| 2008/0037861 A1 * | 2/2008 | Nikolsky | 382/149 |
| 2011/0078638 A1 * | 3/2011 | Kahng et al. | 716/52 |
| 2013/0036397 A1 * | 2/2013 | Lee et al. | 716/122 |
| 2013/0074018 A1 * | 3/2013 | Hsu et al. | 716/55 |
| 2013/0080980 A1 * | 3/2013 | Wang et al. | 716/52 |
| 2013/0091476 A1 * | 4/2013 | Chen et al. | 716/55 |
| 2013/0159955 A1 * | 6/2013 | Ghaida et al. | 716/119 |
| 2013/0179848 A1 * | 7/2013 | Liu et al. | 716/55 |
| 2013/0179855 A1 * | 7/2013 | Elliott | 716/139 |

* cited by examiner

*Primary Examiner* — Brian Ngo
(74) *Attorney, Agent, or Firm* — Sawyer Law Group, P.C.

(57) ABSTRACT

Computer-implemented method, system and computer program product for double patterning technology (DPT) odd loops visualization within an integrated circuit design layout are disclosed. The method, system and computer program product comprise mapping all violations of the integrated circuit design layout to a graph. The method, system and computer programming product also includes partitioning the graph into a plurality of sub-graphs. Each of the plurality of sub-graphs includes multiple edges and multiple nodes. The method, system and computer product further include detecting all possible odd loops in each of the plurality of sub-graphs; and visualizing all of the odd loops in at least one of the plurality of sub-graphs.

26 Claims, 14 Drawing Sheets

PATTERN WITH MULTIPLE SAME
MASK SPACING VIOLATION

FEASIBILITY WITHOUT DPT.
INCREASED THE SPACING OF
SAME MASK GEOMETRIES

FIG. 2B

DOUBLE PATTERN
WITH SPLITTING WITHOUT ERRORS

METHOD AND SYSTEM FOR DOUBLE PATTERNING TECHNOLOGY (DPT) ODD LOOP VISUALIZATION FOR AN INTEGRATED CIRCUIT LAYOUT

FIELD OF THE INVENTION

The present invention relates generally to integrated circuit design and more specifically to a method and system for DPT odd loop visualization for an integrated circuit layout.

BACKGROUND

The physical layout of a very-large scale integration ("VLSI") design has to adhere to certain design rules. Typically, a Design Rule Checking (DRC) tool is utilized to ensure that a given layout conforms to the set of design rules. The design rules, provided by the manufacturer and specific to a process node, are necessary to ensure the devices are manufacturable and can be produced at an appropriate yield.

If the layout does not adhere to one or more of these rules then the tool has to inform the designer about design rule violations and the designer has to fix each of the design rule violations before the design is considered clean. Design rules are complex in low geometric nodes and different sets of new methodologies are adding to the complexity.

Double patterning technology or DPT is a process which has been adopted for the lower geometric nodes to avoid the resultant geometric distortion due to lithographic issues. At these lower geometric nodes, for example 20 nm technology and below, it is not economically feasible to manufacture integrated circuits (ICs) with the conventional lithographic technology due to the optical resolution limit. When utilizing DPT, alternate masks are used for the printing of images instead of the single mask used in conventional lithographic method. However, although DPT allows the printing of the image at 20 nm or below technology, but it brings associated rules and complexity. One of the complex issues is an "odd loop", where it is difficult to assign an appropriate mask to print the appropriate image. Accordingly, the detection and visualization of the odd loops in a comprehensive way is a challenge.

Accordingly, what is needed is a method and system for detecting and visualizing odd loops in a DPT process. The method and system should be simple to implement, cost effective and adaptable to existing environments. The present invention addresses such a need.

SUMMARY OF THE INVENTION

Computer-implemented method, system and computer program product for double patterning technology (DPT) odd loops visualization within an integrated circuit design layout are disclosed. The method, system and computer program product comprise mapping all violations of the integrated circuit design layout to a graph. The method, system and computer programming product also includes partitioning the graph into a plurality of sub-graphs. Each of the plurality of sub-graphs includes multiple edges and multiple nodes. The method, system and computer product further include detecting all possible odd loops in each of the plurality of sub-graphs; and visualizing all of the odd loops in at least one of the plurality of sub-graphs.

Other aspects and advantages of the present invention will become apparent from the following detailed description, taken in conjunction with the accompanying drawings which illustrate, by way of example, the principles of the invention.

DETAILED DESCRIPTION OF PREFERRED EMBODIMENTS

The present invention relates generally to integrated circuit design and more specifically to a method and system for visualizing design rule violations on derived layers in such devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The physical layout of a very-large scale integration ("VLSI") design has to adhere to certain design rules. Typically, a Design Rule Checking (DRC) tool is utilized to ensure that a given layout conforms to the set of design rules. The design rules, provided by the manufacturer and specific to a process node, are necessary to ensure the devices are manufacturable and can be produced at an appropriate yield.

If the layout does not adhere to one or more of these rules, then the tool has to inform the designer about (design rule) violations, and designer has to fix each of them before the design is considered design rule clean. In older process nodes (180 nm and above), it was enough for a DRC tool/module to inform the engineer about two things:

Which design rule was violated?
Which area of the layout did the violation occur in?
In most cases, this information was sufficient for the designer to understand the underlying reason for a violation and therefore effectively fix the violation. However, design rules have become very complex in lower geometric nodes and different sets of new methodologies are adding to the complexity.

Figure 1:
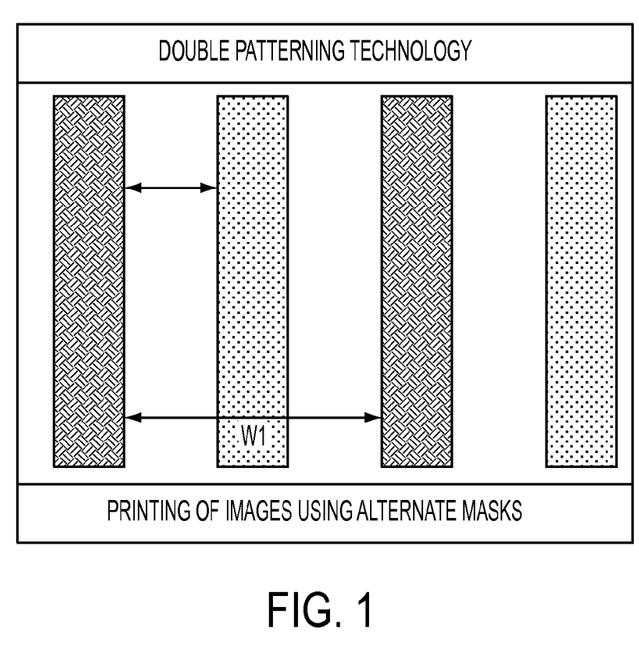
FIG. 1 illustrates a layout which illustrates multiple shapes.

In technologies that are 20 nm and below it is not economically feasible to manufacture ICs with the conventional lithographic technology due to the optical resolution limit. Utilizing DPT, alternate masks are used for the printing of the images instead of the single mask used in the conventional lithographic method. FIG. 1 illustrates a layout 10 which illustrates multiple shapes. In FIG. 1, the shapes 12 and 14 are separated by the layer minimum spacing. At smaller process nodes a single mask cannot print both of them; hence in the given example two types of masks are used. Alternate masks are spaced by the layer minimum spacing, where the same type of masks are spaced by more than double spacing of the minimum layer spacing value.

Double patterning is a process of splitting a layer into two separate masks (for example two masks of different colors such as red and green) to increase layout density.

For example, utilizing a single mask based technology, the two shapes need to be a certain distance apart (as specified by a DRM rule that specifies minSpacing for that layer), otherwise it is not possible to manufacture them.

However, when utilizing DPT, the two shapes are provided on separate masks. Of course, even with separate masks, the shapes still cannot be closer than a certain distance—however, this distance is lesser than the single mask minSpacing distance. For ease of reference here, the term sameMaskSpacing is utilized to refer to the spacing requirements for shapes on the same mask, and diffMaskSpacing for spacing requirements for shapes on separate masks. Note that diffMaskSpacing<sameMaskSpacing.

Figures 2A, 2B:
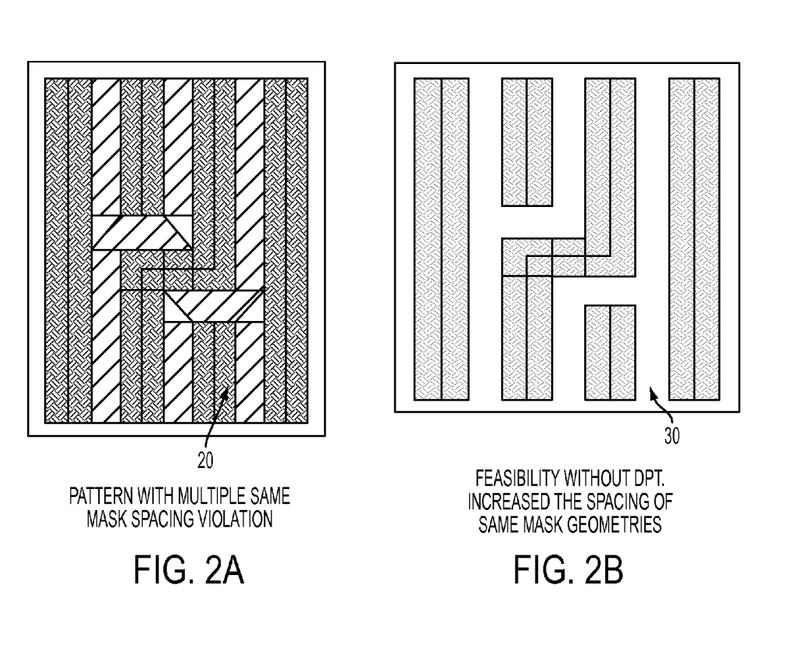
FIGS. 2A and 2B illustrate an example of using a single mask based approach.

FIGS. 2A and 2B illustrate an example of using a single mask based approach. As is seen in FIG. 2A, when using the single mask approach the desired pattern 20 has multiple violations. The only way to address this issue is to increase the spacing 30 between the shapes shown in FIG. 2B. Now, consider a situation where two shapes are on the same mask and are closer than the distance specified in sameMaskspacing. Though this is a violation, a simple solution is to move one of the shapes to the other mask.

Figure 3:
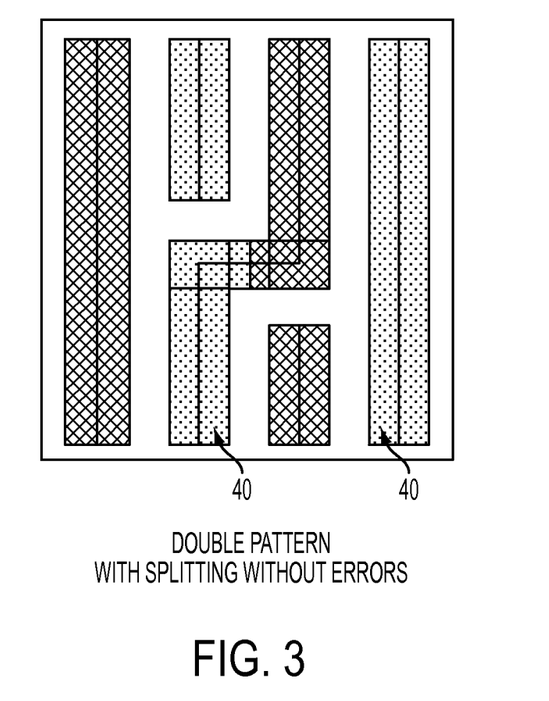
FIG. 3 illustrates an example of using a two mask based approach to address this violation by splitting some shapes (or components of a shape) to a second mask.

FIG. 3 illustrates an example of using a two mask based approach to address this violation by splitting some shapes 40 (or components of a shape) to a second mask.

Figure 4:
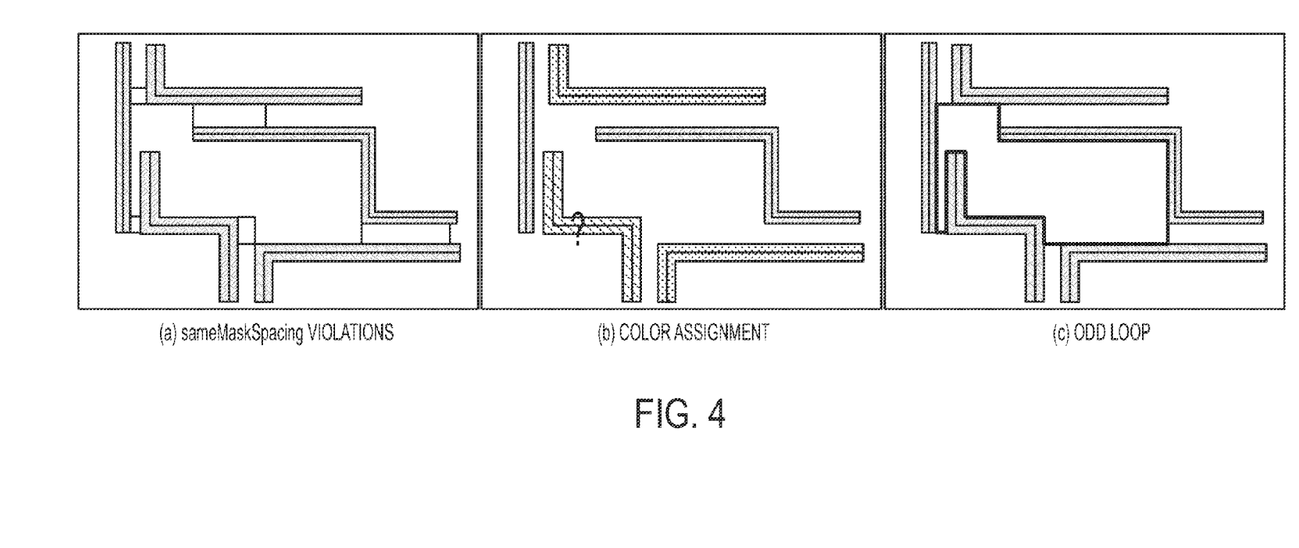
FIG. 4 illustrates a layout with shapes that have same-MaskSpacing violations therebetween.

The technique commonly used for addressing the violation is assigning colors to the shapes that are involved in same mask spacing violation. If two shapes are involved in a sameMaskSpacing violation, they can be given different colors. Referring to FIG. 4, as is seen there are 5 shapes involved, and 5 pairwise sameMaskSpacing violations between them. Starting with the leftmost shape, and moving in a clockwise direction, and starting with the color "B", colors can be assigned as "B", "R", "B", "R" but the fifth shape cannot be colored either "R" or "B" due to its proximity to one R shape and one B shape.

However, as is seen, this approach can become quite complex, because the same shapes can be involved in multiple sameMaskSpacing violations. Accordingly, what is needed is a method to determine if it is possible to assign colors to shapes without a violation occurring.

The problem of manufacturability in dual mask systems can be reduced to a problem of detecting "odd loops" formed by shapes violating the sameMaskSpacing rule in the design. Accordingly, the way to correct this violation is by breaking the loop. As can be seen in the FIG. 4, the odd loop can be broken by moving one of the shapes away from the others so that is more than sameMaskSpacing distance away. Two things to note here are that this is a fairly simplistic example, and that there are 5 possible ways to fix it here. In real life designs there would be many more complex cases and scenarios.

It has been determined that if the sameMaskSpacing requirement forms an odd loop (a loop with 2n+1 number of vertices) that a violation occurs. That is, whenever the violations of type sameMaskSpacing form an odd loop, then it is not possible to color that shape. This in turn implies that the integrated circuit design layout cannot be manufactured.

Odd loops can be quite complex and can involve shapes spanning over multiple areas of the design. It is not easy for the user to understand which shapes were involved, and how to picture the underlying violations in a simple enough manner to be able to fix them. Accordingly what is needed is a system and method to encapsulate the key information regarding an odd loop violation in an easy to understand manner and show it to the user in such a manner that the underlying pattern is easily determined and potential fixes can be easily identified.

Accordingly a system and method in accordance with the present invention identifies DPT odd loops in an integrated circuit layout design and visualizes the odd loops that in a most comprehensive way so that the designer can identify an existing DPT odd loop in the design and fix it in the easiest way.

Figure 5A:
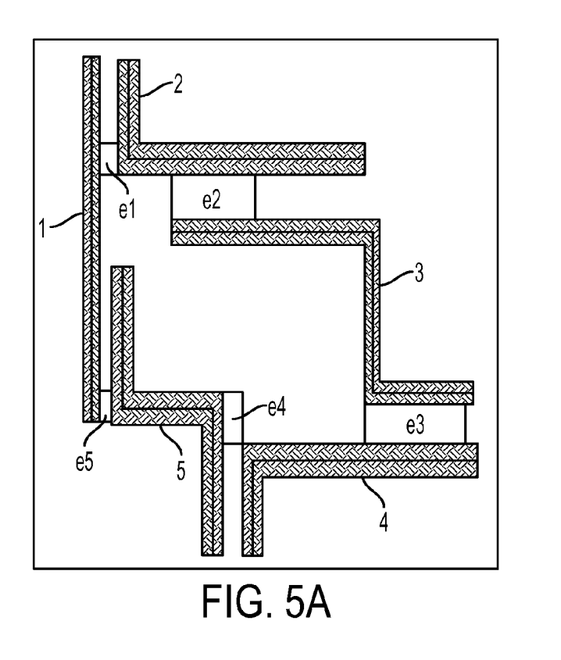
FIG. 5A illustrates a layout with shapes that have same-MaskSpacing violations therebetween.
Figure 5B:
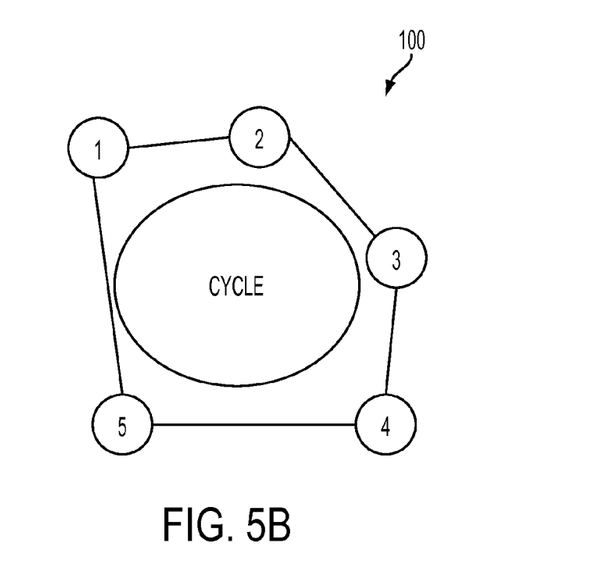
FIG. 5B represents an equivalent graph of the shapes of FIG. 5A.

The system and method for visualizing odd loops in accordance with an embodiment can be divide in to the following categories:

Mapping a DPT loop problem into a graph problem.
Partitioning the complete layout into sub-graphs to represent the disjoint clusters.
Detect all possible cycle/loop in the graph or sub-graph.
Visualizing the loops in the layout.
Visualize the loop in a graph or sub-graph corresponding to the loop in the layout To describe the features of the present invention in more detail refer now to the following description in conjunction with the accompanying figures. Referring now to FIG. 5A, shown are five shapes on a layout which are marked with {1, 2, 3, 4, 5} and there are five sameMaskSpacing violations marked with {e1, e2, e3, e4, e5}. FIG. 5B represents an equivalent graph 100 of the five shapes of the layout FIG. 5A. The key attributes of the graph 100 are: Every shape which is part of a sameMaskSpacing violation is a node (vertex) of the graph. Every violation between the shapes is an edge of the graph. An odd loop is a cycle of the graph where number of vertices is odd. An odd loop indicates non colorable graph problem.

The key features of graph visualization are described hereinbelow. A sub-graph is invoked from Annotation browser. Every node represents a shape involved in a sameMaskSpacing violation and every edge represents a sameMaskSpacing violation. A loop violation which is a part of sub-graph would bring up the entire sub-graph. Each node and edge of the sub-graph can be probed with the layout geometries and the loop markers. Each sub-graph can be modified keeping the connectivity intact.

Figure 6:
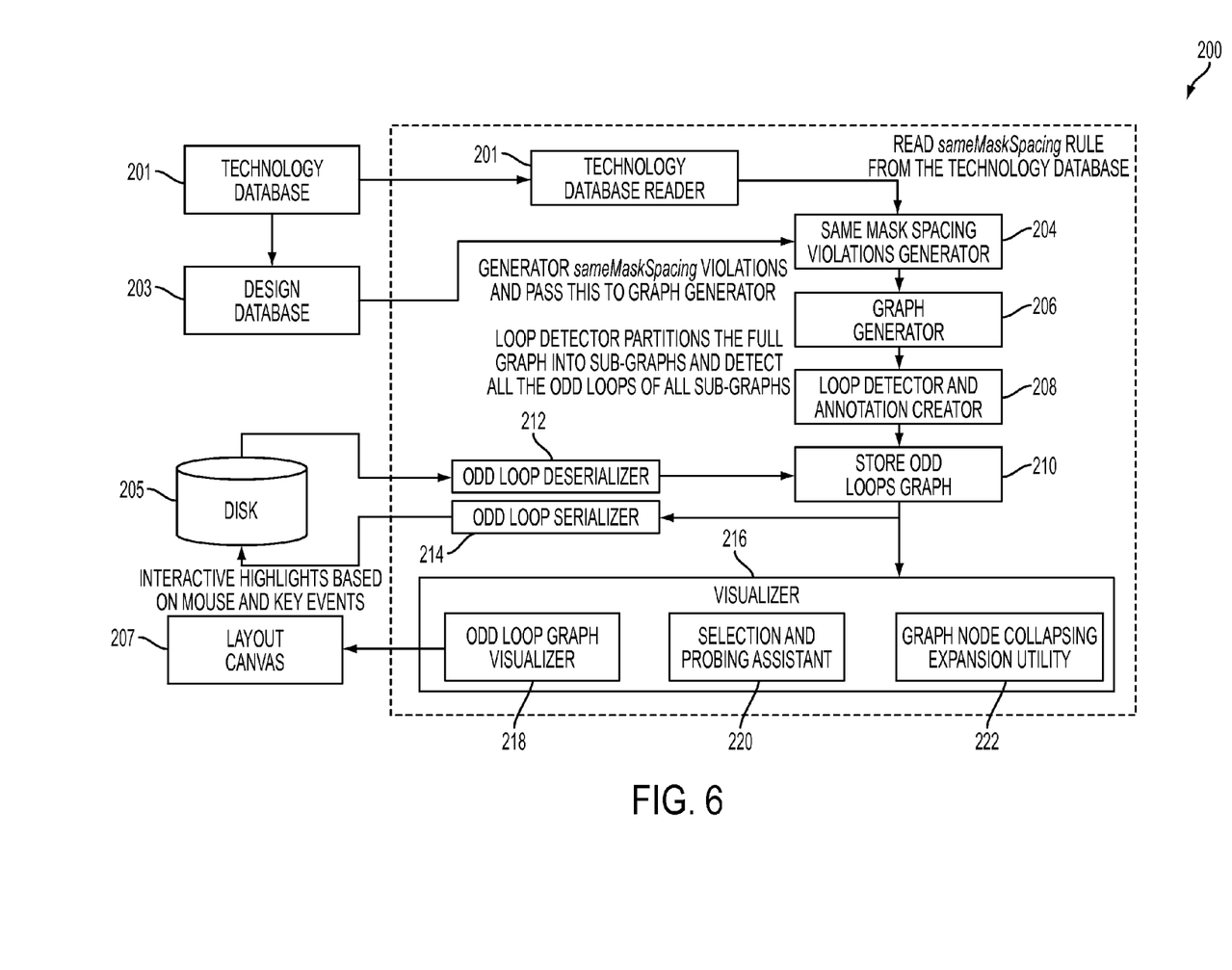
FIG. 6 is a block diagram of a DPT odd loop visualization system in accordance with an embodiment.

FIG. 6 is a block diagram of a DPT odd loop visualization system 200 in accordance with an embodiment. There elements will be described in more detail hereinbelow in conjunction with the accompanying figures.

1. Technology Database Reader 202:

The reader 202 parses and read the sameMaskSpacing Rule available in technology database 201.

2. Same Mask Spacing Violations Generator 204:

The generator 204 is a checking utility which checks the design database 203 and generates all the sameMaskSpacing violations in the in the design on a given layer.

Figure 7:
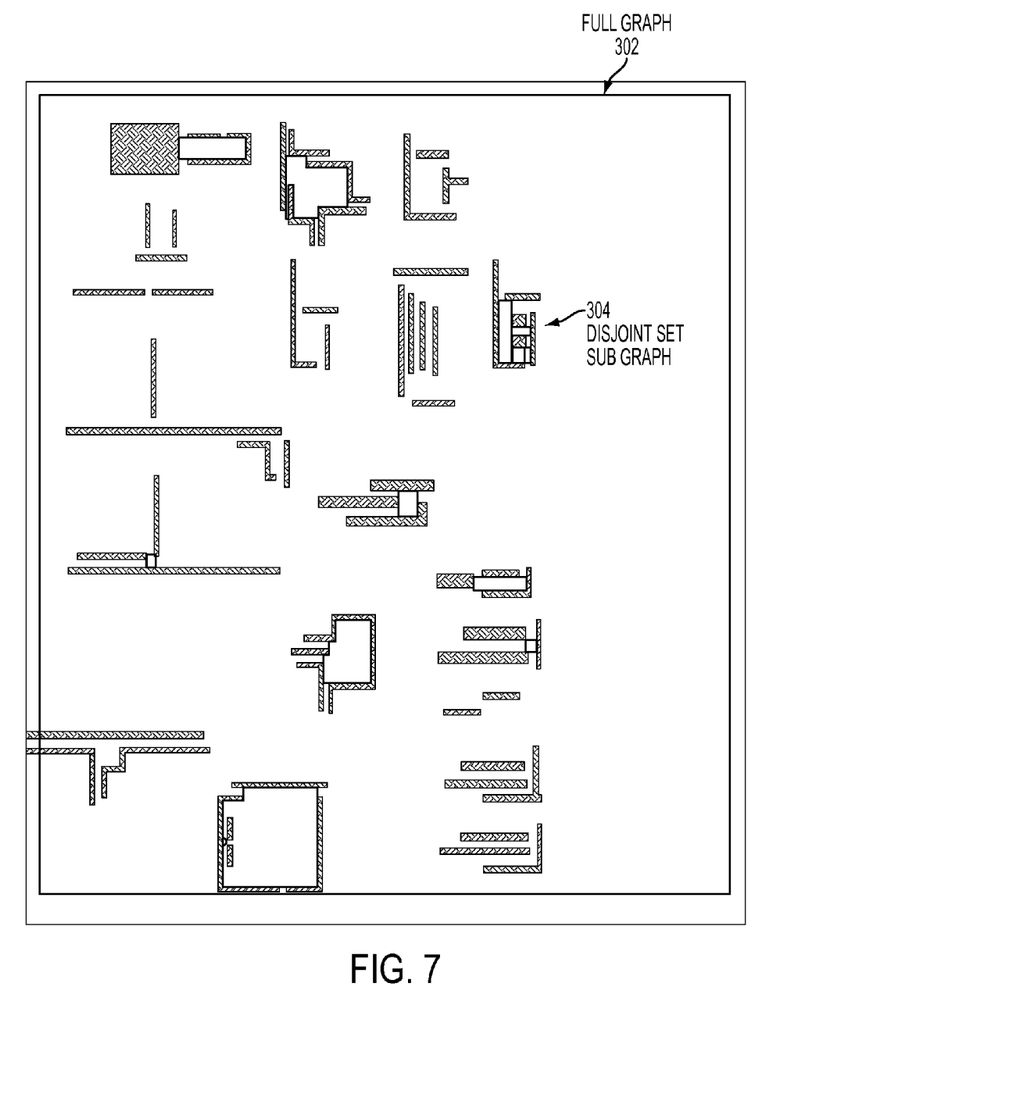
FIG. 7 illustrates partitioning a full graph into sub-graphs.

3. Graph Creator 206:

The graph creator 206 is responsible for generating a full graph on the basis of the sameMaskSpacing violations, provided by the generator 204. The graph creator 206 also partitions the full graph 302 into small sub-graphs 302 as shown in FIG. 7. The full graph 302 represents the mapping of all sameMaskViolations into a single graph on given layer in a given design. The full graph 302 includes several sub-graphs 304 which are disjoint to each other. These sameMaskSpacing violations on a layer may be a disjoint set of violations (disjoint clusters) as shown as shown in FIG. 7. The full graph 302 typically is too complicated hence the full graph 302 is partitioned into several sub-graphs 304 and the detection is performed on an individual sub-graph 304.

4. Loop Detector and Annotation Creator 208:

The loop detector and annotation creator 208 detects odd loops in all sub-graphs and creates odd loop annotations. To describe the features of creator 208 refer now to the following description.

Figure 8A:
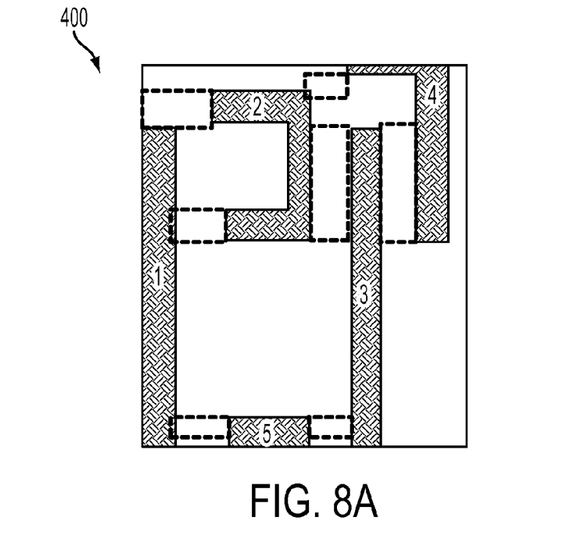
FIG. 8A illustrates a layout with violations.
Figure 8B:
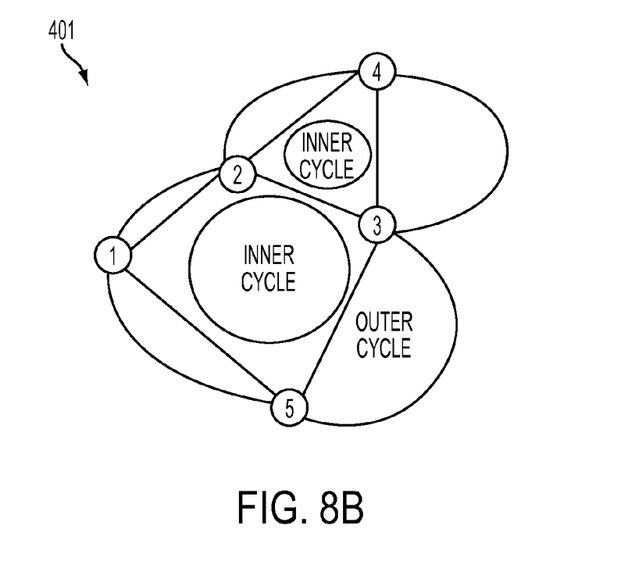
FIG. 8B illustrates a graph of the layout of FIG. 7A where there are three loops and two of the loops are odd loops.

In the given graph or sub-graph it is important to find the all possible odd loops because every loop is a separate violation and each of them needs to be fixed. FIG. 8A illustrates a layout 400 with violations. FIG. 8B illustrates a sub-graph 401 of the layout 400 of FIG. 8A where there are three loops and two of the loops are odd loops. Even loops are not violations and odd loops need to be detected.

It is important how odd loops are visualized in a layout platform. Here with the selection of a loop marker in an annotation browser, the loop marker and the associated sameMaskSpacing marker would be highlighted.

5. Odd Loop Graph Storage 210:

The odd loop graph storage 210 temporarily stores the sub-graph information that includes odd loops into the database. The stored sub-graph information is used to visualize sub-graphs on a canvas of the layout.

6. Odd Loop Visualizer 212:

The odd loop visualizer 212 includes three sub-modules: an Odd Loop Graph Visualizer 218; a Selection and Probing Assistant 220 and a Node Collapsing/Expansion Utility 222. The operation of each of these sub-modules will be discussed in more detail below.

Odd Loop Graph Visualizer 218:

The responsibility of this graph visualizer 218 is to animate a graph in a sub window corresponding to a cluster in the layout.

Figure 9:
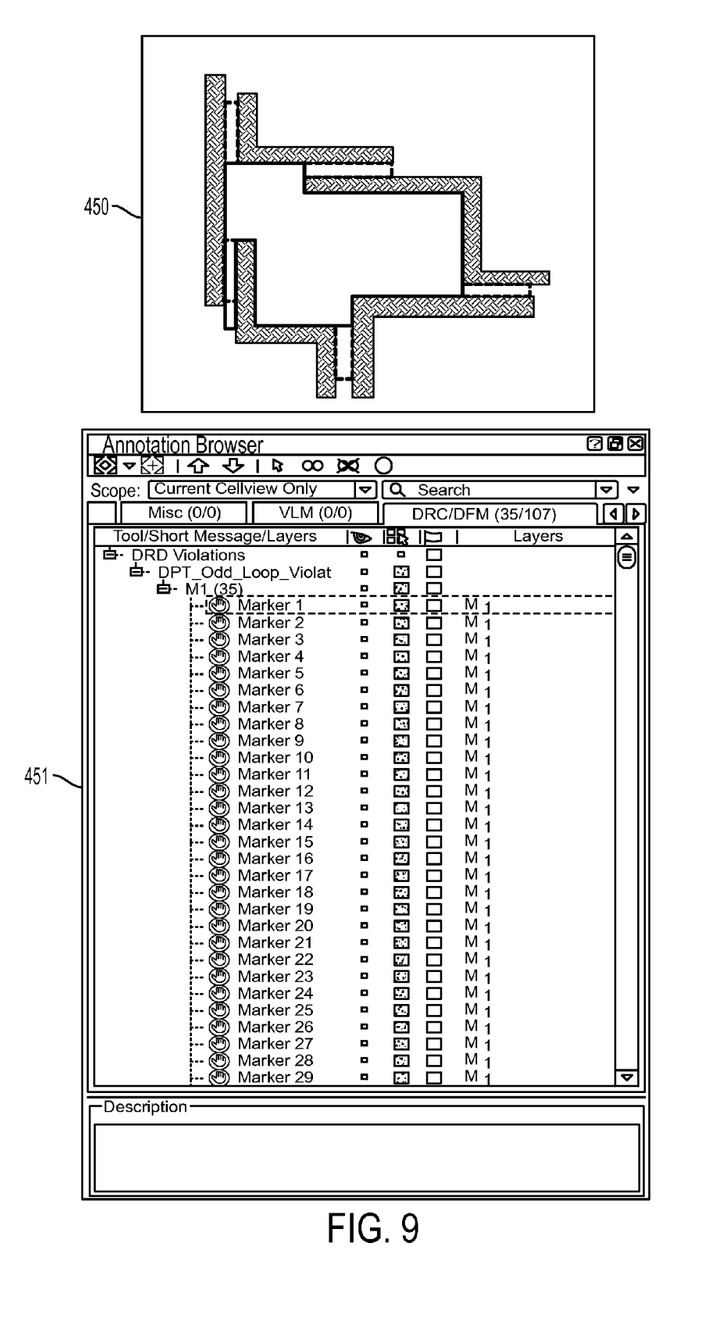
FIG. 9 illustrates violations on a layout 450 along with the associated annotation browser layout editor of the layout.
Figure 10:
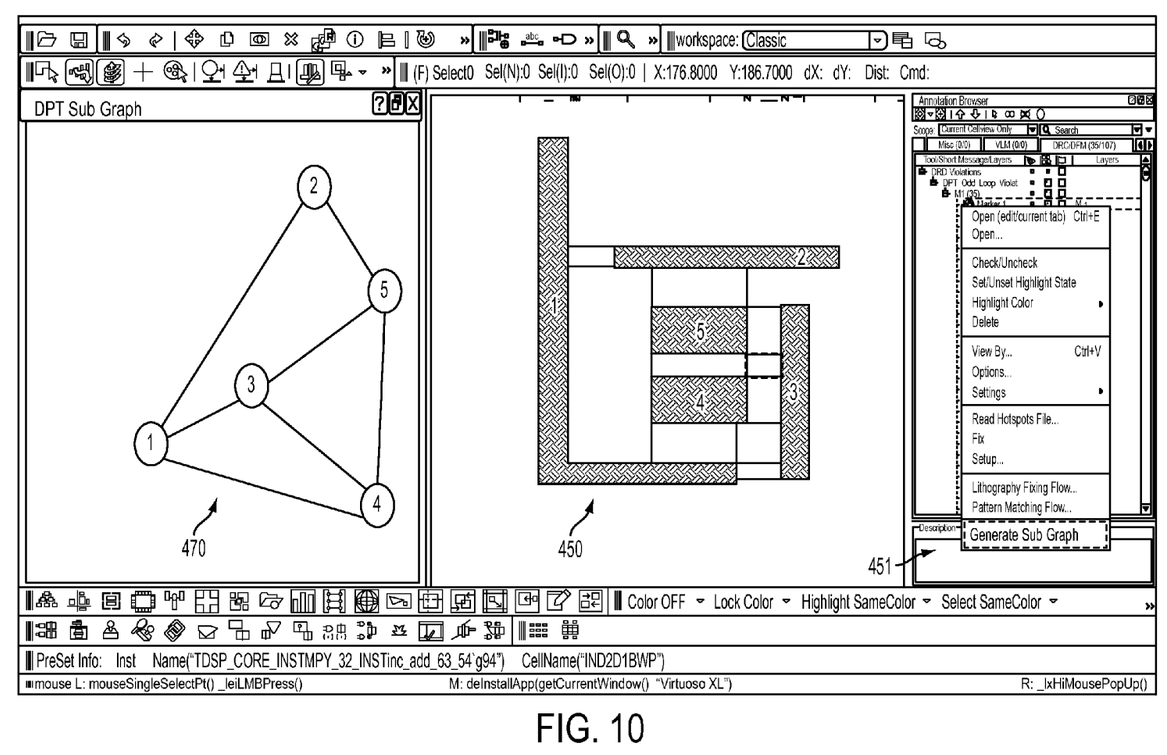
FIGS. 10-12 shows how a graph is invoked from an annotation browser and would be shown in sub window of layout editor.

FIG. 9 illustrates violations on a layout 450 along with the associated annotation browser layout editor 451 of the layout 450. A polygon marker (typically colored in red) on the layout is a loop marker and a loop violation (shown for example in white) is shown along with the sameMaskSpacing violations. A graph 470 is invoked from the annotation browser 451 and would be shown in sub window of layout editor as shown in FIG. 10.

Figure 11:
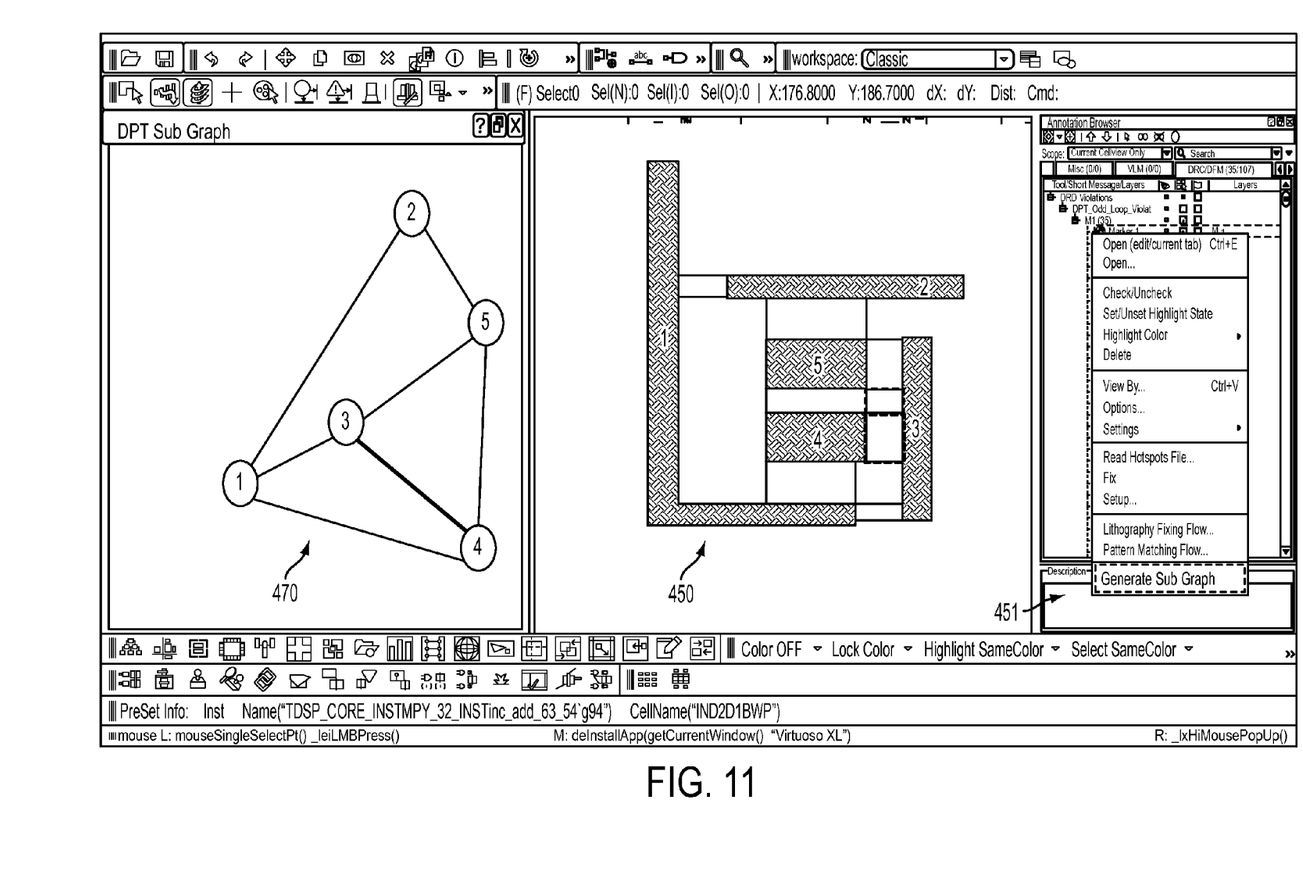

The advantage of this mechanism is that the users can easily identify and analyze the odd loops in the graph 470 and can decide interactively the best edge to be broken (remove the associated violation) to remove the odd loops. Here an edge can be shared between multiple cycles and removing the appropriate edge can remove the maximum number of cycles. Removing an edge {3,4} (highlighted, for example, with a dotted line which could be a red color) as shown in FIG. 11 would remove all the odd cycles in the graph 470. This gives the users an upfront capability to fix the loop problem in the best possible manner interactively.

b. Selection and Probing Assistant 220:

The Probing assistant 220 provides the capability to select a node or an edge of a graph or sub-graph and highlight corresponding shape or the violation in the layout. Here probing represents one to one mapping between the graph or sub-graph objects (edge, node) to the corresponding layout objects. If one edge in the graph is selected it would highlights the corresponding violation in layout. Similarly if a node is selected in the graph it would highlight corresponding shape in the layout. This would also help highlighting the cycles in the graph, as seen in FIG. 11. The user is also able to change the relative position of the graph by keeping the connectivity intact. This would help the user to understand the loop much better way.

Figure 12:
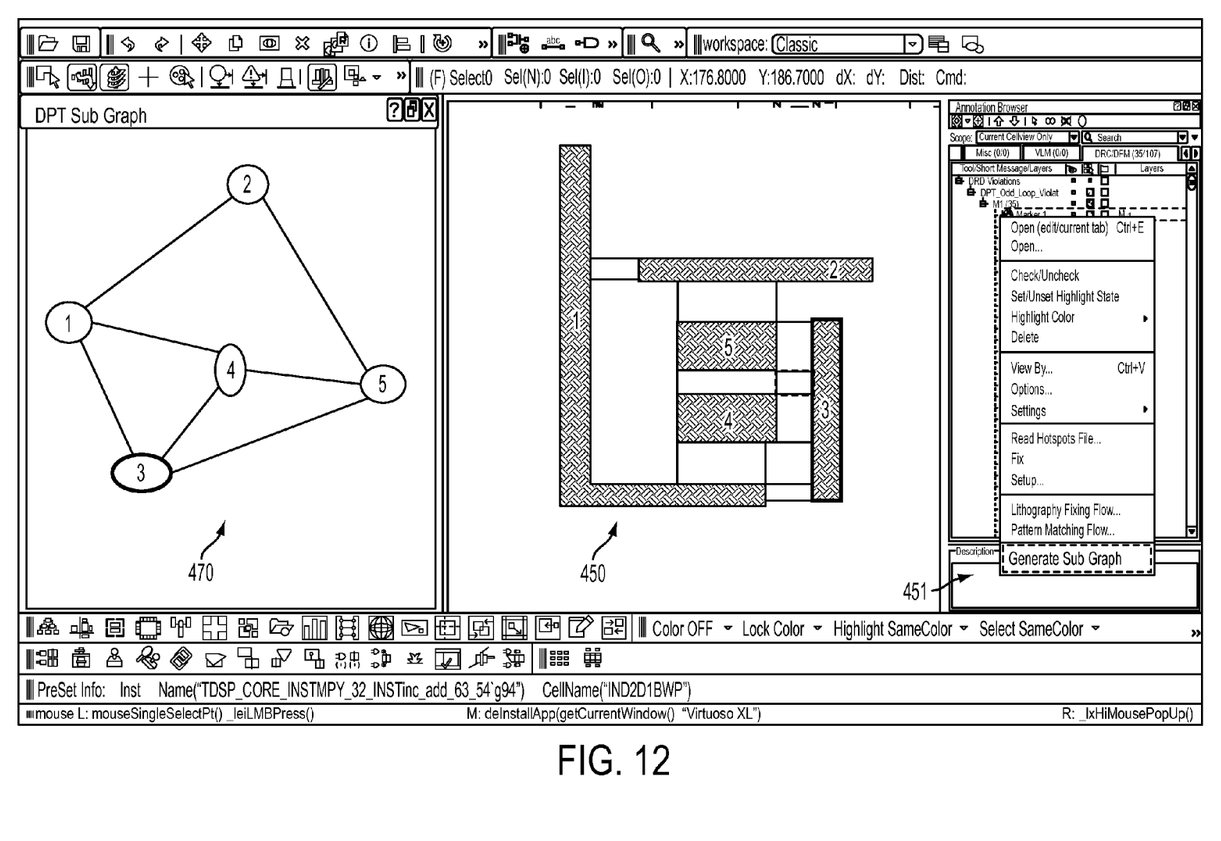

Comparing FIGS. 11 and 12, the only difference in the graphs is the relative positions of the graph nodes. The positions of the nodes are changed but the connections remain same. This will help the user to visualize and analyze the graph or sub-graph in a more comprehensive manner. This is very useful, specifically when the graph or sub-graph is complicated.

c. Node Collapsing/Expansion Utility 222:

The Node Collapsing Expansion utility 220 provides the capability to collapse multiple nodes into a single node. It will also provide the capability to expand it back to the original state.

Figure 13:
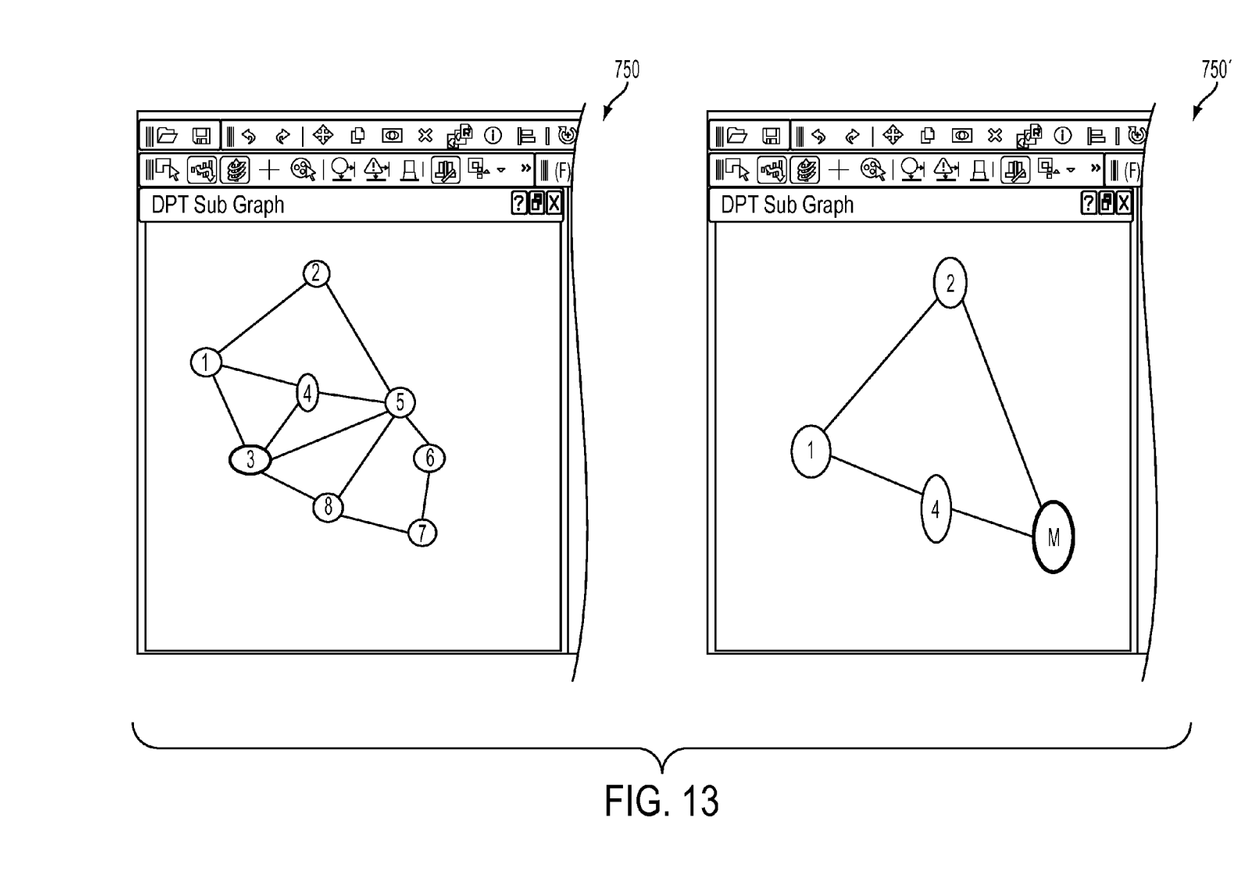
FIG. 13 illustrates nodes of a sub graph merged into a single node M.

Hence, for example, if a cluster is too big then the sub-graph might appear complicated. An option to collapse multiple nodes into a single node, so that one can inspect an individual loop more accurately. The collapsed node can also be expanded back to its original form. FIG. 13 illustrates nodes {3, 8, 6, 7, 5} of a sub graph merged into a single node M.

Advantages

A DPT odd loop detection and visualization method and system accordance with the present invention provides the following features:

a process of detecting an odd loops in a given layout;
a mechanism to visualize DPT odd loops in virtuoso layout editor;
a capability to visualize the odd loops in form of a graph;
a capability of probing between the graph and layout;
to better analyze the loops, sub-graphs can be modified keeping the connectivity intact;
multiple nodes can be merged into a single node, to keep the graph or sub graph simpler.

All of these features allow a user to easily identify an odd loop in the layout as well as possible easiest way of fixing it.

System Overview

Figure 14:
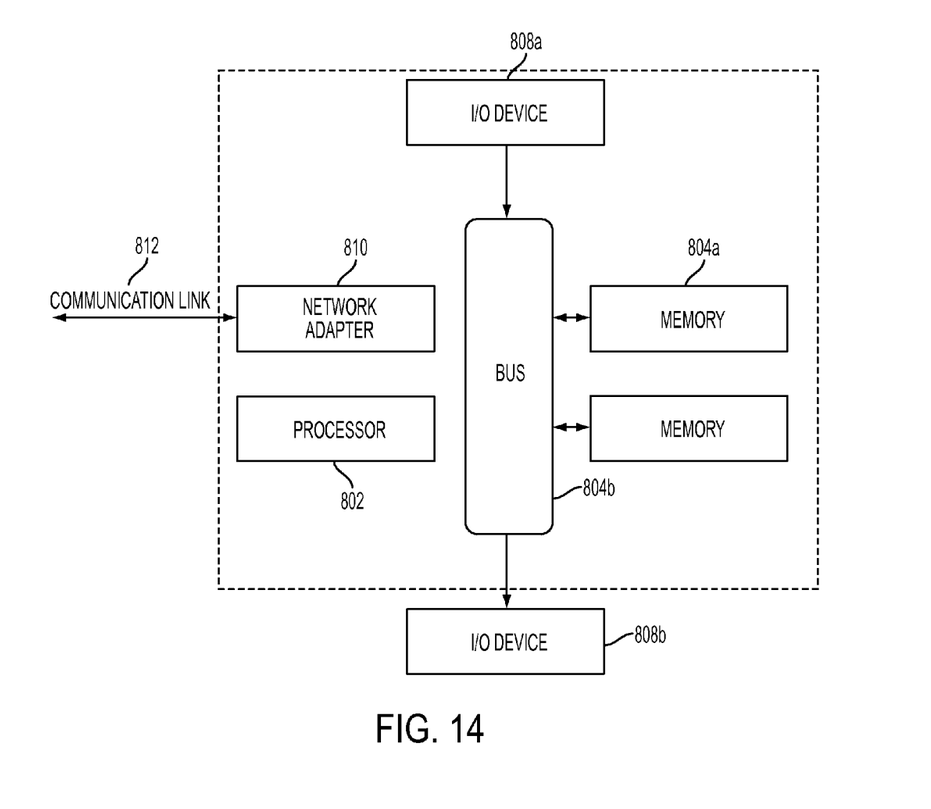
FIG. 14 illustrates a data processing system suitable for storing the computer program product and/or executing program code in accordance with an embodiment of the present invention.

FIG. 15 illustrates a data processing system 800 suitable for storing the computer program product and/or executing program code in accordance with an embodiment of the present invention. The data processing system 800 includes a processor 802 coupled to memory elements 804*a-b* through a system bus 806. In other embodiments, the data processing system 800 may include more than one processor and each processor may be coupled directly or indirectly to one or more memory elements through a system bus.

Memory elements 804*a-b* can include local memory employed during actual execution of the program code, bulk storage, and cache memories that provide temporary storage of at least some program code in order to reduce the number of times the code must be retrieved from bulk storage during execution. As shown, input/output or I/O devices 808*a-b* (including, but not limited to, keyboards, displays, pointing devices, etc.) are coupled to the data processing system 800. I/O devices 908*a*-*b* may be coupled to the data processing system 800 directly or indirectly through intervening I/O controllers (not shown).

In FIG. 15, a network adapter 810 is coupled to the data processing system 802 to enable data processing system 802 to become coupled to other data processing systems or remote printers or storage devices through communication link 812. Communication link 812 can be a private or public network. Modems, cable modems, and Ethernet cards are just a few of the currently available types of network adapters.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer-implemented method for double patterning technology (DPT) odd loops visualization within an integrated circuit design layout, the method comprising:
    mapping, by using a computer, a plurality of violations of the integrated circuit design layout to a graph;
    partitioning the graph into a plurality of sub-graphs, wherein each of the plurality of sub-graphs include a plurality of edges and a plurality of nodes, wherein at least one set of the plurality of nodes are collapsible into a single node to enable more accurate inspection of an individual loop;
    detecting a plurality of odd loops in each of the plurality of sub-graphs; and
    visualizing the plurality of odd loops in both at least one of the plurality of sub-graphs and a corresponding integrated circuit design layout.

2. The computer-implemented method of claim 1, wherein every shape of the integrated circuit layout which is part of a violation is a node of the graph or a sub-graph and every violation between shapes on the integrated circuit layout is an edge of the graph or a sub-graph.

3. The computer-implemented method of claim 1, wherein an odd loop indicates that every shape of the integrated circuit layout which is part of a violation is a node of the graph or a sub-graph.

4. The computer-implemented method of claim 1, wherein every shape of the integrated circuit layout is assigned one of two colors.

5. The computer-implemented method of claim 4, wherein an odd loop indicates a non colorable graph problem between shapes.

6. The computer-implemented method of claim 1, wherein the visualizing step comprises animating the graph in a sub window of a display corresponding to the integrated circuit design layout.

7. The computer-implemented method of claim 1, wherein the visualizing step comprises selecting an edge or node of one of the plurality of sub-graphs and highlighting a corresponding violation on the integrated circuit design layout.

8. The computer-implemented method of claim 1, wherein the visualizing step comprises collapsing multiple nodes into a single node.

9. The computer-implemented method of claim 8, wherein the visualizing step further comprises expanding the single node back to the multiple nodes.

10. The computer-implemented method of claim 1, wherein the odd loops are annotated for the user.

11. The computer-implemented method of claim 1, wherein the violations are sameMaskSpacing violations.

12. A computer program product containing program instructions stored in a non-transitory computer readable storage medium for visualizing derived layer shapes of an integrated circuit design; the program instruction being executed by a computer; wherein the computer performs the following steps comprising;
    mapping, by using a computer, a plurality of violations of the integrated circuit design layout to a graph;
    partitioning the graph into a plurality of sub-graphs, wherein each of the plurality of sub-graphs include a plurality of edges and a plurality of nodes, wherein at least one set of the plurality of nodes are collapsible into a single node to enable more accurate inspection of an individual loop;
    detecting a plurality of odd loops in each of the plurality of sub-graphs; and
    visualizing the plurality of odd loops in both at least one of the plurality of sub-graphs and a corresponding integrated circuit design layout.

13. The computer program product of claim 12, wherein every shape of the integrated circuit layout which is part of a violation is a node of the graph or a sub-graph and every violation between shapes on the integrated circuit layout is an edge of the graph or a sub-graph.

14. The computer program product of claim 12, wherein an odd loop indicates that every shape of the integrated circuit layout which is part of a violation is a node of the graph or a sub-graph.

15. The computer program product of claim 12, wherein every shape of the integrated circuit layout is assigned one of two colors.

16. The computer program product of claim 15, wherein an odd loop indicates a non colorable graph problem between shapes.

17. The computer program product of claim 12, wherein the visualizing step comprises animating the graph in a sub window of a display corresponding to the integrated circuit design layout.

18. The computer program product of claim 12, wherein the visualizing step comprises selecting an edge or node of one of the plurality of sub-graphs and highlighting a corresponding violation on the integrated circuit design layout.

19. The computer program product of claim 12, wherein the visualizing step further comprises collapsing multiple nodes into a single node.

20. The computer program product of claim 19, wherein the visualizing step comprises expanding the single node back to the multiple nodes.

21. The computer program product of claim 12, wherein the odd loops are annotated for the user.

22. The computer program product of claim 12, wherein the violations are sameMaskSpacing violations.

23. A system for double patterning technology (DPT) odd loops visualization within an integrated circuit design layout, the system comprising:
    a graph generator module configured to map a plurality of violations of the integrated circuit design layout to a graph and to partition the graph into a plurality of sub-graphs, wherein each of the plurality of sub-graphs include a plurality of edges and a plurality of nodes, wherein at least one set of the plurality of nodes are collapsible into a single node to enable more accurate inspection of an individual loop;
    a detector module for detecting a plurality of possible odd loops in each of the plurality of sub-graphs; and a visualizer module configured to allow for the visualization of the plurality of odd loops in both at least one of the plurality of sub-graphs and the corresponding integrated circuit design layout.

24. The system of claim 23, wherein every shape of the integrated circuit layout which is part of a violation is a node of the graph or a sub-graph and every violation between shapes on the integrated circuit layout is an edge of the graph or a sub-graph.

25. The system of claim 23, wherein an odd loop indicates that every shape of the integrated circuit layout which is part of a violation is a node of the graph or a sub-graph.

26. The system of claim 23, wherein every shape of the integrated circuit layout is assigned one of two colors.

* * * * *